(12) United States Patent
Schnell et al.

(10) Patent No.: US 7,376,042 B2
(45) Date of Patent: May 20, 2008

(54) BOOSTED CLOCK CIRCUIT FOR SEMICONDUCTOR MEMORY

(75) Inventors: Josef Schnell, Charlotte, VT (US); Helmut Seitz, Sauerlach (DE)

(73) Assignee: Qimonda AG, Munich (DE)

( * ) Notice: Subject to any disclaimer, the term of this patent is extended or adjusted under 35 U.S.C. 154(b) by 114 days.

(21) Appl. No.: 11/492,636

(22) Filed: Jul. 25, 2006

(65) Prior Publication Data
US 2008/0031057 A1  Feb. 7, 2008

(51) Int. Cl.
*G11C 8/00* (2006.01)
*G11C 5/14* (2006.01)
*G11C 7/00* (2006.01)

(52) U.S. Cl. ............. 365/233; 365/189.09; 365/189.11

(58) Field of Classification Search ........... 365/189.09, 365/189.11, 233
See application file for complete search history.

(56) References Cited

U.S. PATENT DOCUMENTS

| | | | |
|---|---|---|---|
| 6,476,594 B1 * | 11/2002 | Roisen | 324/76.54 |
| 6,987,700 B1 | 1/2006 | Hong et al. | |
| 7,042,260 B2 * | 5/2006 | Choi | 327/156 |
| 7,042,269 B2 | 5/2006 | Kao | |
| 7,046,066 B2 | 5/2006 | Saado et al. | |
| 2002/0110042 A1 * | 8/2002 | Dubey | 365/233 |
| 2003/0037271 A1 * | 2/2003 | Liu et al. | 713/322 |

FOREIGN PATENT DOCUMENTS

JP  2000035831 A * 2/2000

* cited by examiner

*Primary Examiner*—Ly Duy Pham
(74) *Attorney, Agent, or Firm*—Dicke, Billig & Czaja, PLLC

(57) ABSTRACT

A memory component includes at least one memory bank array, a DQ region, a clock tree, and a voltage generator. The memory component is configured in a semiconductor wafer. The at least one memory bank array is configured such that data is read out of it during a read operation. The clock tree is coupled to the DQ region and is configured for driving data during the read operation. The voltage generator is coupled to at least some components of the clock tree in order to provide at least some of the components of the clock tree with an increased voltage.

20 Claims, 4 Drawing Sheets

BOOSTED CLOCK CIRCUIT FOR SEMICONDUCTOR MEMORY

BACKGROUND

In many present day DRAM applications or in systems incorporating a DRAM, maximizing system performance is a significant consideration. Certain time constraints and delays in retrieving data from the system DRAM can affect overall system performance. Even very small time segments can affect performance. For example, during a read operation data is typically presented on data pads to be clocked out of the system memory for only a short period of time. As such, the clocking out of that data must occur within that short window of time during which it is presented, or there can be a failure. For this and other reasons, a need exists for the present invention.

SUMMARY

One embodiment of the present invention provides a memory component. The memory component includes at least one memory bank array, a DQ region, a clock tree, and a voltage generator. The memory component is configured in a semiconductor wafer. The at least one memory bank array is configured such that data is read out of it during a read operation. The clock tree is coupled to the DQ region and is configured for driving data during the read operation. The voltage generator is coupled to at least some components of the clock tree in order to provide at least some of the components of the clock tree with an increased voltage.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
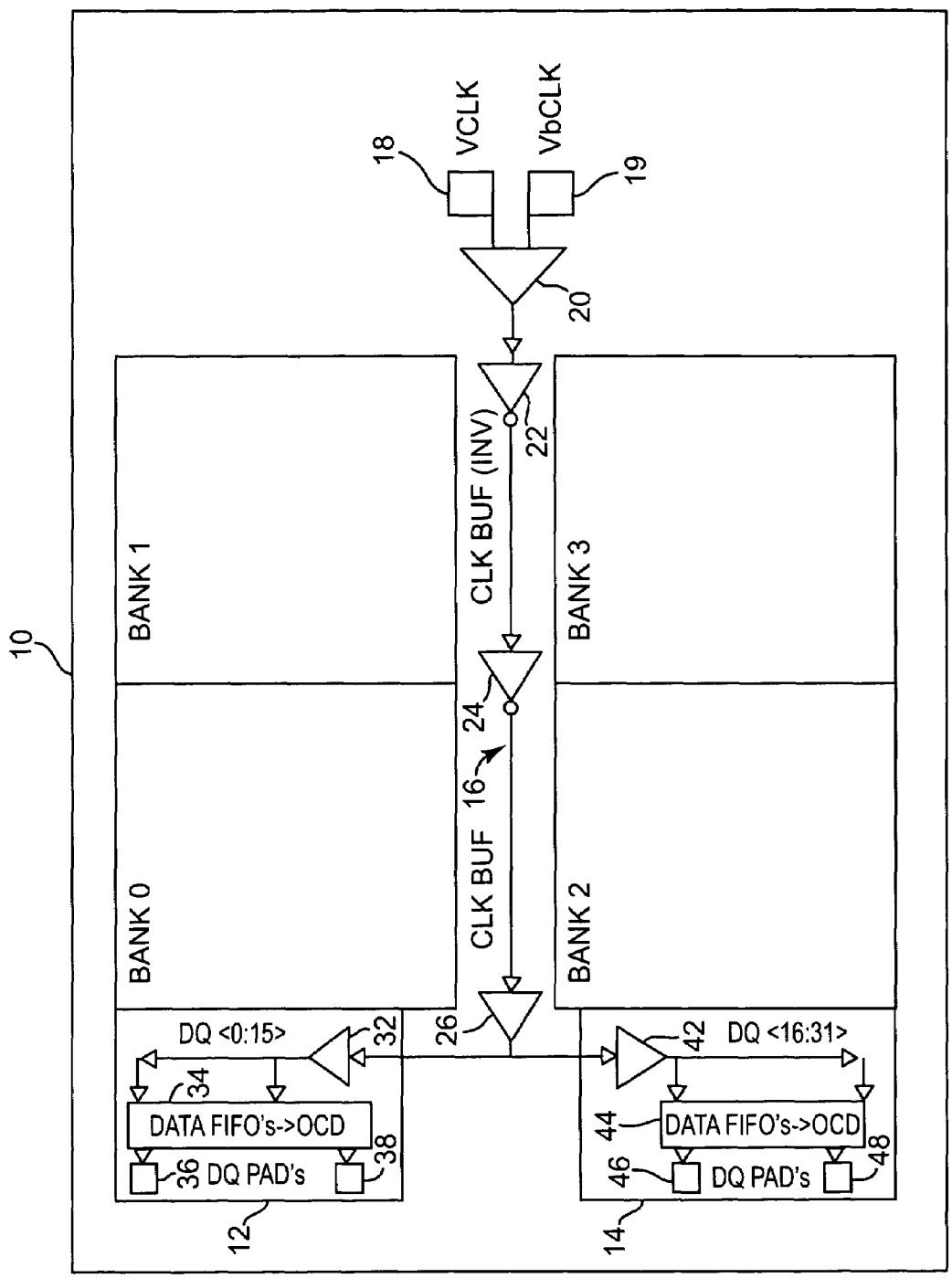
FIG. 1 is a block diagram illustrating an exemplary memory device.

FIG. 1 illustrates a memory device 10 with an edge pad arrangement and multiple memory banks. In one embodiment, memory device 10 includes four memory bank arrays: bank 0, bank 1, bank 2, and bank 3. Memory device 10 further includes first DQ region 12, second DQ region 14 and clock tree 16. Access to the four memory banks is provided by a data path coupled between the memory banks and first and second DQ regions 12 and 14, via which data is read from bank 0, bank 1, bank 2, and/or bank 3.

In one embodiment memory device 10 is a low power DRAM chip, such as a low power DDR SDRAM. Bank 0, bank 1, bank 2, and bank 3 are organized in a square or rectangular-shaped configuration on the semiconductor memory device 10. In some cases, first and second DQ regions 12 and 14 are physically located adjacent the edge of the semiconductor chip (as illustrated in FIG. 1) and in other applications they are situated between the memory banks on the chip. In various embodiments, data pads can be configured to accommodate 16-bit, 32-bit or other system architecture.

In one embodiment, first DQ region 12 includes driver 32, data FIFO and off-chip drivers ("OCD") 34, and data pads ("DQ pads") 36 and 38. Similarly, second DQ region 14 includes driver 42, data FIFO and off-chip drivers ("OCD") 44, and data pads ("DQ pads") 46 and 48. The DQ pads 36, 38, 46, and 48 and OCD 34 and 44 are coupled to buffer and multiplexing logic and the data path.

In operation, command and address pads (not specifically illustrated) receive command and address signals for retrieving data from the various memory banks (bank 0, bank 1, bank 2, and bank 3) in memory device 10. Data is then retrieved from the various memory banks via DQ pads 36, 38, 46, and 48 in first and second DQ regions 12 and 14. DQ pads 36, 38, 46, and 48 are coupled to paths that allow data to be transmitted off memory device 10.

In one embodiment, differential clock signals VCLK and VbCLK are provided to clock pads 18 and 19. Clock pads 18 and 19 are configured to receive differential clock signals VCLK and VbCLK from off memory device 10, such as from a memory controller or other device coupled to memory device 10. These clock signals then received by a clock receiver 20, which in turn is used to drive clock tree 16. Clock tree 16 in turn drives DQ pads 36, 38, 46, and 48 and OCD 34 and 44 in first and second DQ regions 12 and 14 during a data read operation of memory device 10.

In one embodiment, clock tree 16 is coupled between clock receiver 20 on one end and first and second DQ regions 12 and 14 on another end. In one case, clock tree 16 includes first clock buffer inverter 22, second clock buffer inverter 24, and clock buffer 26. Metal wires connected between first and second clock buffer inverters 22 and 24, and between second clock buffer inverter 24 and clock buffer 26 are illustrated with arrows. In one embodiment, differential clock signals VCLK and VbCLK drive clock tree 16, which in turn drives first and second DQ regions 12 and 14 during a data read operation.

Figure 2:
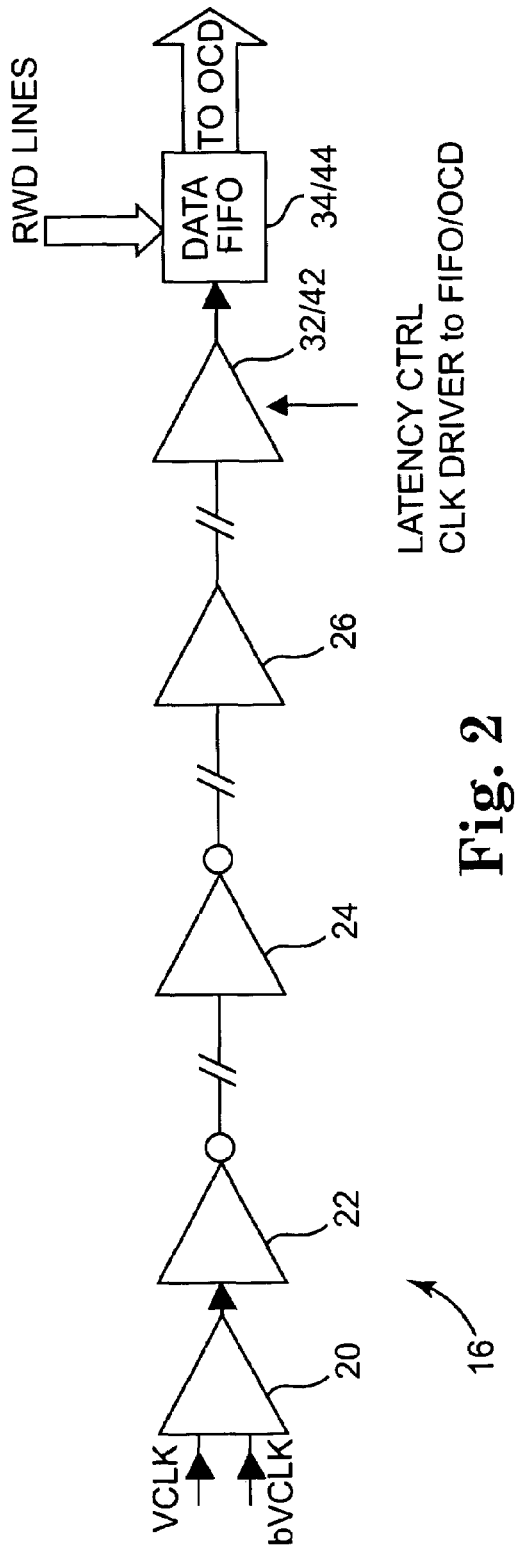
FIG. 2 is a block diagram illustrating an exemplary clock tree circuit for use in a memory device.

FIG. 2 illustrates a simplified block diagram of clock tree circuit 16 that can be configured for use in a memory device, such as memory device 10 in FIG. 1. Illustrated clock tree circuit 16 is configured between clock receiver 20 on one end and latency control clock driver 32/42 on the other. Clock tree 16 includes first clock buffer inverter 22, second clock buffer inverter 24, and clock buffer 26, with metal wires connected therebetween.

First clock receiver 20 is illustrated receiving differential clock signals VCLK and VbCLK for driving clock tree 16 on a front end. Clock tree 16 is illustrated driving a latency control clock driver 32/42 at a back end. Latency control clock driver 32/42 in turn drives data FIFO 34/44, such as data FIFO 34 of first DQ region 12 and data FIFO 44 of second DQ region 14 of memory device 10 illustrated in FIG. 1. Read data enters data FIFO 34/44 via read/write data lines (RWD) and is then driven off the memory device via off-chip drivers ("OCD") in response to clock driver 32/42.

Figure 3:
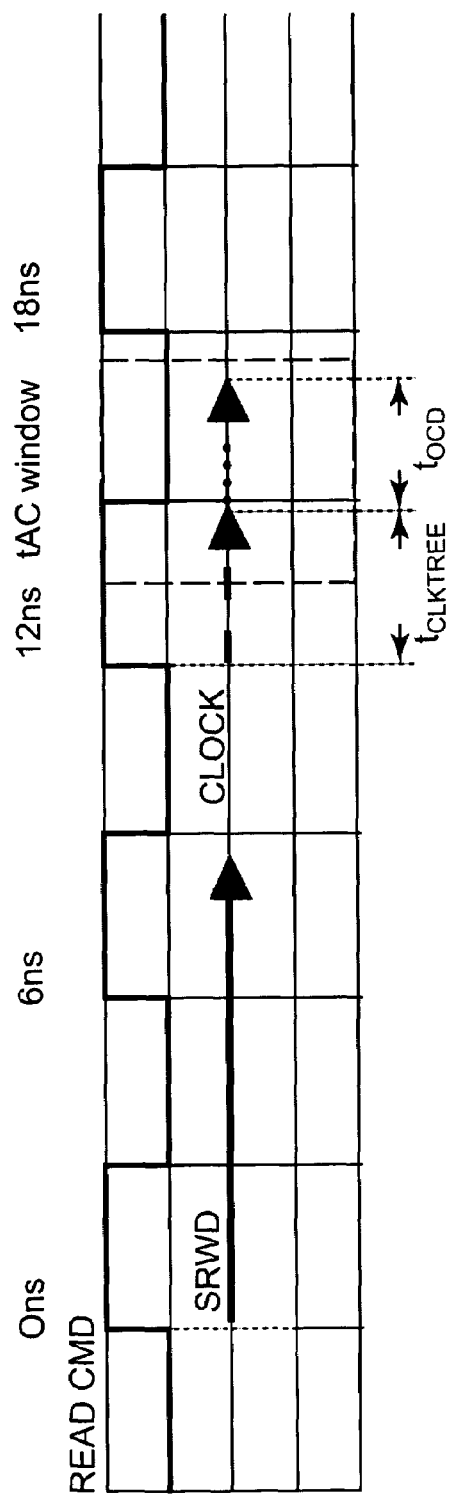
FIG. 3 is a timing diagram illustrating exemplary timing signals for an exemplary clock tree circuit for use in a memory device.

FIG. 3 illustrates exemplary data and clock signals timing signals for one clock tree circuit 16 for use in a memory device, such as memory device 10. A clock signal is illustrated across the top of the figure with a first transition at time=0 nanoseconds (0 ns), and with consecutive transitions occurring each 6 nanoseconds (6 ns) thereafter. In the illustration, a read command is issued at time=0 nanoseconds. The horizontal arrow (SRWD) illustrates the issued read command. After the read command is issued, data is then clocked out at the second clock cycle after the read command, which in the example is at 12 nanoseconds (12 ns).

During a read operation, data is available to be clocked out onto the data bus during what is typically referred to as the memory access time or "tAC window." The tAC window is defined as the data access time during which the clock has to drive out data. In FIG. 3 the tAC window is illustrated with two vertical dotted lines at either end of the tAC window. In FIG. 3, the left side or front end of the tAC window appears after the second clock cycle just after the read command (just after 12 nanoseconds) and the right side or back end of the tAC window appears just before the third clock cycle after the read command (18 nanoseconds). As such, in the illustration, data has to arrive within an approximately 2 to 5.5 nanoseconds tAC window (between 14-17.5 nanoseconds) after the read command is issued.

As is also illustrated in FIG. 3, there is a delay between the issuance of the read command until data is ready on the DQ pads to be driven to the data bus during the tAC window. This delay affects the tAC performance. Various delay components contribute to the overall tAC performance. In the exemplary clock tree 16 of FIG. 2, some of the delay is attributable to each of clock receiver 20, first clock buffer inverter 22, second clock buffer inverter 24, clock buffer 26, latency control clock driver 32/42, data FIFO 34/44, as well as the OCD.

In many applications, the characteristics, and thus timing delay, of a number of these components are set by the specification parameters of the application. For example, the characteristics of the clock receiver 20 and OCD are often determined by specification parameters in many memory applications. For example, the input/output slew rate of the clock receiver 20 and OCD may be set by the application. As such, in many applications these delay components are set by the design.

Some of these component timing delays are illustrated within the tAC window in FIG. 3. Some of the timing delay is due to the time consumed by components of clock tree 16 (for example, first clock buffer inverter 22, second clock buffer inverter 24, clock buffer 26), and this clock tree delay is illustrated by the horizontal dashed arrow labeled $t_{CLKTREE}$. The output timing delay due to the OCD is illustrated by the horizontal dotted arrow labeled $t_{OCD}$ with vertical markers. In one instance, the clock tree delay $t_{CLKTREE}$ is 2.5 nanoseconds and the OCD delay $t_{OCD}$ is 1 nanosecond.

Since the delay of the various components is cumulative, any additional or increased delay from any of the components can cause critical error in some situations. For example, if the cumulative delay caused by the various components is too great, the tAC window will be closed before all of the delay is complete. In other words, if the cumulative delay caused by the clock tree delay $t_{CLKTREE}$ and the OCD delay $t_{OCD}$ is such that the cumulative sum of the dashed arrow of $t_{CLKTREE}$ and the dotted arrow of $t_{OCD}$ extends beyond the back side of the tAC window (right-most dashed vertical line), error will occur in clocking data onto the data bus from the DQ pads.

In the illustration, the cumulative delay is just inside the tAC window, that is, the end of the dotted arrow of $t_{OCD}$ is just to the left of the back end of the tAC vertical dashed line. If any of the delay components were even slightly longer, however, the end of the dotted arrow of $t_{OCD}$ would move to the right of the back end of the tAC vertical dashed line, thereby indicating an error situation.

Figure 4:
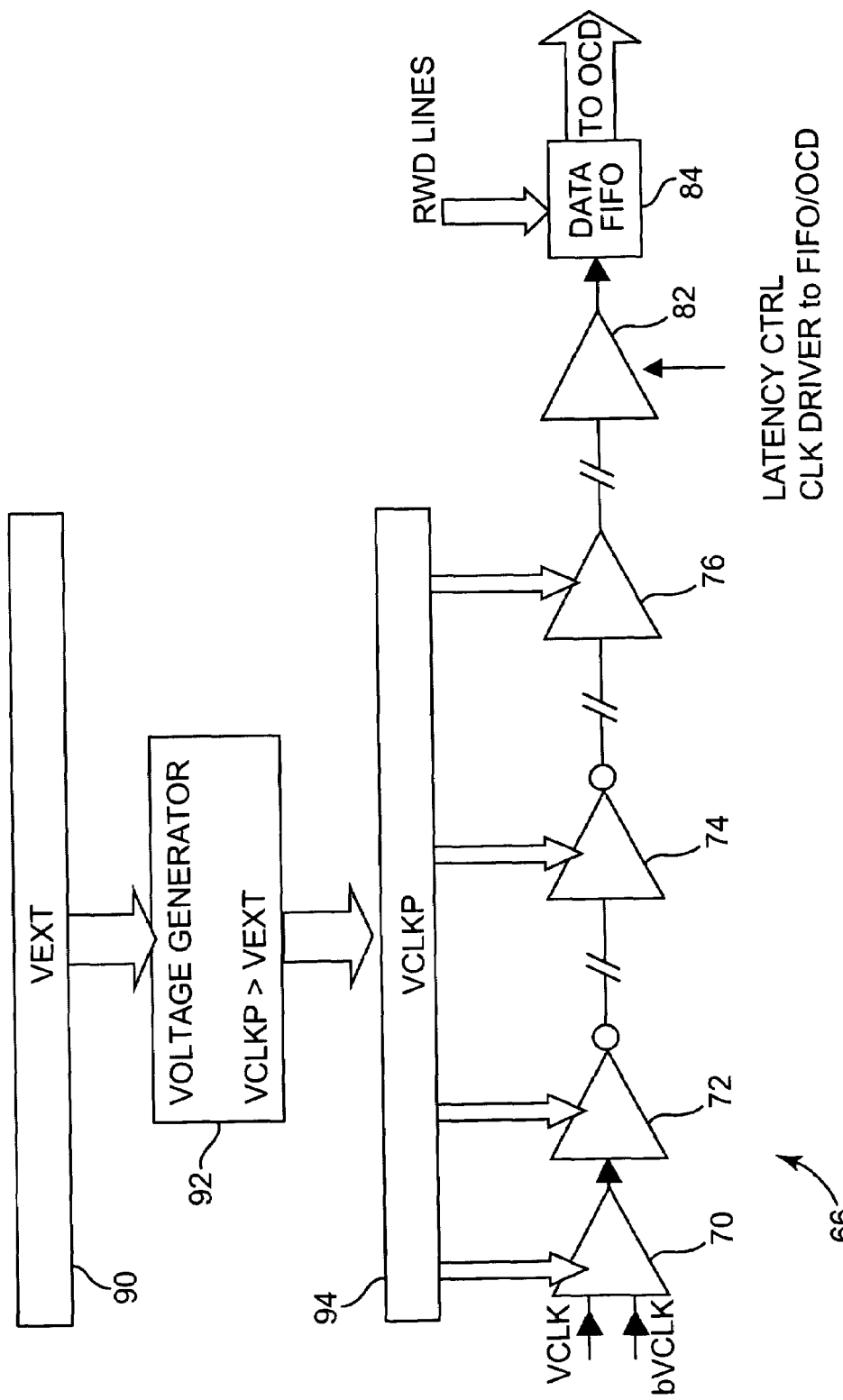
FIG. 4 is a block diagram illustrating a clock tree circuit for use in a memory device in accordance with one embodiment of the present invention.

FIG. 4 illustrates a clock tree circuit 66 in accordance with one embodiment of the present invention. Clock tree 66 can be configured for use in a memory device, such as memory device 10 in FIG. 1. Illustrated clock tree circuit 66 is configured between clock receiver 70 on one end and latency control clock driver 82 on the other. In one embodiment, clock tree circuit 66 is provided with a boosted voltage, which in one case, improves tAC performance.

Clock receiver 70 is illustrated receiving differential clock signals VCLK and VbCLK for driving clock tree 66 on a front end. Clock tree 66 is illustrated driving a latency control clock driver 82 at a back end. Latency control clock driver 82 in turn drives data FIFO 84, such as data FIFO 34 of first DQ region 12 and/or data FIFO 44 of second DQ region 14 of memory device 10 illustrated in FIG. 1. Read data enters data FIFO 84 via read/write data lines (RWD) and is then driven off the memory device via off-chip drivers ("OCD") in response to clock driver 82.

Clock tree circuit 66 includes first clock buffer inverter 72, second clock buffer inverter 74, and clock buffer 76, with metal wires connected therebetween. Furthermore, in one embodiment, elements of clock tree 66 are provided with a boosted voltage (VCLKP). In one embodiment, the boosted voltage (VCLKP) improves the performance of clock tree 66, and specifically, the components of clock tree 66 to which it is coupled, such that the clock tree delay $t_{CLKTREE}$ is shortened. In some cases, this improves tAC performance in that it ensures that data is clocked out onto the data bus within the tAC window.

In one embodiment, an external voltage (VEXT) is supplied to a memory device (such as memory device 10 illustrated in FIG. 1) on which clock tree 66 is located. For example, external voltage (VEXT) can be supplied from off memory device 10, such as from a memory controller or other device coupled to memory device 10. The external voltage (VEXT) is then available on first voltage supply 90. Rather than couple the external voltage (VEXT) to clock tree 66, however, a voltage generator 92 is coupled to first voltage supply 90. Voltage generator 92 then accepts the external voltage (VEXT) and increases its level. In one case, the external voltage (VEXT) is increased to an elevated voltage (VCLKP) by voltage generator 92. This elevated voltage (VCLKP) is then provided to second voltage supply 94. In one embodiment, first voltage supply 90, voltage generator 92, and second voltage supply 94 are all provided one the same memory device with clock tree circuit 66, such as on memory device 10.

In one embodiment, the elevated voltage (VCLKP) of second voltage supply 94 is coupled to components of the clock tree 66. In one embodiment, second voltage supply 94 provides elevated voltage (VCLKP) to each of clock receiver 70, first clock buffer inverter 72, second clock buffer inverter 74, and clock buffer 76. Due to the higher voltage (VCLKP), the delay of the clock receiver 70, first clock buffer inverter 72, second clock buffer inverter 74, and clock buffer 76, including the RC component, is reduced. This results in an improved tAC performance.

Figure 5:
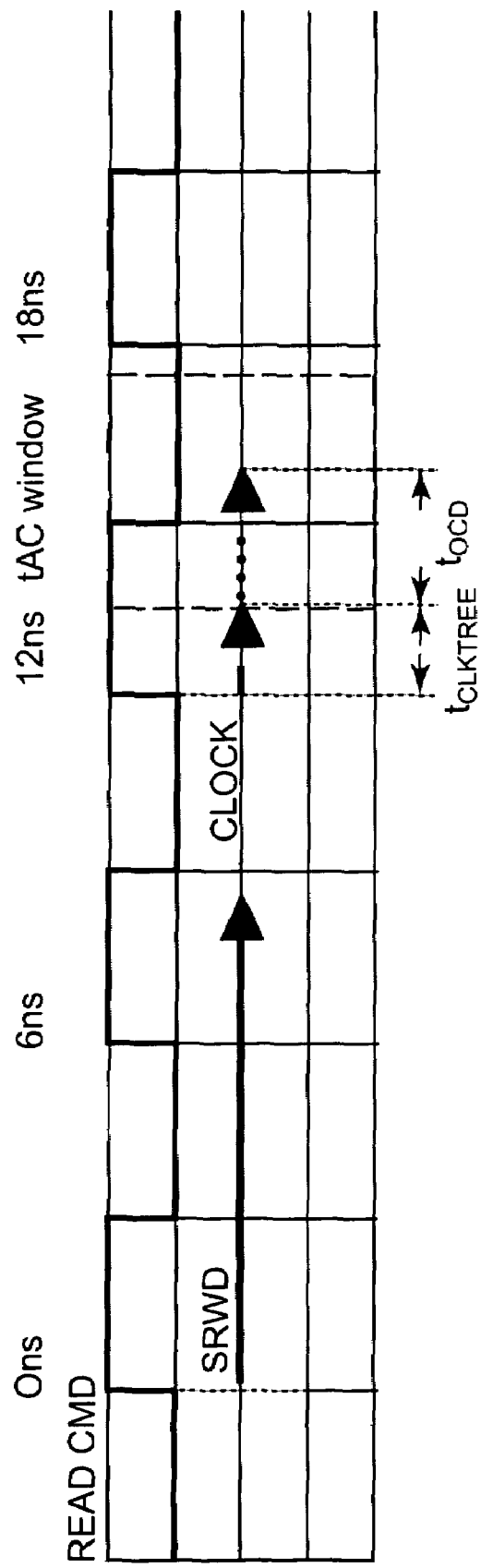
FIG. 5 is a timing diagram illustrating timing signals for a clock tree circuit for use in a memory device in accordance with one embodiment of the present invention.

In order to further illustrate the embodiment of clock tree circuit 66 in FIG. 4, some of the timing signals for the embodiment are illustrated in the timing diagram of FIG. 5. The timing signals are similar to those illustrated in FIG. 3. A clock signal is illustrated across the top of the figure with a first transition at time=0 nanoseconds (0 ns), and with consecutive transitions occurring each 6 nanoseconds (6 ns) thereafter. In the illustration, a read command is issued at time=0 nanoseconds. The horizontal arrow (SRWVD) illustrates the issued read command. After the read command is issued, data is then clocked out onto the data bus at the second clock cycle after the read command, which is at 12 nanoseconds (12 ns).

Again, during a read operation, data is available to be clocked out onto the data bus during the tAC window (illustrated in FIG. 5, as it was in FIG. 3, with two vertical dotted lines at either end of the tAC window). As with FIG. 3, the left side or front end of the tAC window in FIG. 5 appears just after the second clock cycle after the read command (just after 12 nanoseconds) and the right side or back end of the tAC window appears just before the third clock cycle after the read command (18 nanoseconds).

In FIG. 5, the effect of coupling the elevated voltage (VCLKP) of second voltage supply 94 to the components of the clock tree 66 is illustrated by the decrease in the clock tree delay $t_{CLKTREE}$ (illustrated by the horizontal dashed arrow). In FIG. 5, the clock tree delay $t_{CLKTREE}$ shorter than it was in FIG. 3. This is because FIG. 3 illustrated a clock tree that was simply supplied by an external voltage (VEXT), which is lower that elevated voltage (VCLKP), and therefore the associated delay is longer.

In many applications, the characteristics, and thus timing delay, of the OCD is set by the specification parameters of the application. As such, the OCD $t_{OCD}$ delay (illustrated by the dotted horizontal arrow) is the same in FIGS. 3 and 5. Because the delay of the various components is cumulative, however, the shorter clock tree delay $t_{CLKTREE}$ in FIG. 5, the cumulative delay is less relative to the tAC window. In other words, the cumulative delay caused by the clock tree delay $t_{CLKTREE}$ and the OCD delay $t_{OCD}$ is such that the cumulative sum of the dashed arrow of $t_{CLKTREE}$ and the dotted arrow of $t_{OCD}$ extends well short of the back side of the tAC window (right-most dashed vertical line). As such, unlike FIG. 3 where even a slight increase the OCD delay $t_{OCD}$ would push the cumulative delay outside the tAC window, the shortened the clock tree delay $t_{CLKTREE}$ allows for additional delay without pushing the cumulative delay outside the tAC window. In this way, an error in clocking data onto the data bus from the DQ pads is avoided.

In one embodiment, providing the elevated voltage (VCLKP) to the clock tree 66 makes the clock tree delay $t_{CLKTREE}$ one nanosecond shorter than when the clock tree is coupled to an external voltage (VEXT) that is not elevated. In one embodiment, the elevated voltage (VCLKP) can be generated out of the wordline voltage of the system. In one example, this is greater than 2.5 volts. In another embodiment, supply line noise is reduced by buffering the elevated voltage (VCLKP) with trench capacitance along the clock tree.

In one embodiment, the shortened the clock tree delay $t_{CLKTREE}$ due to the provided elevated voltage (VCLKP) allows for applications or specifications that required slightly increased OCD delays $t_{OCD}$. In traditional clock tree circuits this slightly increased OCD delay $t_{OCD}$ could adversely affect tAC performance and cause system error. With clock tree circuit 66 having elevated voltage (VCLKP), error can be avoided in such applications.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory component configured in a semiconductor wafer, the memory component comprising:
   at least one memory bank array out of which data is read during a read operation;
   a DQ region with data pads;
   a clock tree coupled to the DQ region for driving data from the data pads during the read operation; and
   a voltage generator coupled to at least some components of the clock tree in order to provide at least some of the components of the clock tree with a voltage that is increased from an externally applied voltage.

2. The memory component of claim 1, wherein the voltage generator is resident on the semiconductor wafer and coupled to the external voltage.

3. The memory component of claim 1, wherein the clock tree is driven by a differential clock signal from off the semiconductor wafer and wherein the voltage generator generates the increased voltage from the external voltage, which is provided from off the semiconductor wafer.

4. The memory component of claim 3, wherein the increased voltage from the voltage generator is generated out of the wordline voltage of the system.

5. The memory component of claim 1, wherein the memory component is configured as a low power DRAM chip.

6. A memory component configured to clock out data during a read operation, the memory component comprising:
   a plurality of memory bank arrays;
   a plurality of data pads and off-chip drivers within a DQ region of the memory component;
   a clock tree coupled to the DQ region for clocking the data pads and off-chip drivers during the read operation; and
   a voltage generator coupled to the clock tree providing the clock tree with an increased voltage that is higher than an externally applied voltage.

7. The memory component of claim 6, wherein the increased voltage is greater than 2.5 volts.

8. The memory component of claim 7, wherein trench capacitance is provided along the clock tree to buffer the increased voltage and reduce supply line noise.

9. The memory component of claim 8, wherein the clock tree further comprises first and second clock buffer inverters and a clock buffer.

10. A memory component comprising:
   at least one memory bank array out of which data is read during a read operation;
   a plurality of data pads and off-chip drivers on the memory component;
   a clock tree coupled to the data pads and off-chip drivers for driving data during the read operation; and
   means for providing the clock tree with an elevated voltage above an externally applied voltage.

11. The memory component of claim 10, further comprising a voltage generator coupled to the clock tree providing the clock tree with the elevated voltage.

12. The memory component of claim 10, wherein the elevated voltage provided to the clock tree decreases clock tree delay.

13. The memory component of claim 12, wherein the elevated voltage provided to the clock tree decreases the clock tree delay by at least one nanosecond.

14. The memory component of claim 10, wherein the elevated voltage provided to the clock tree improves tAC performance.

15. A method for reading from a memory component, the method comprising:
   reading from at least one memory bank array during a read operation;
   providing a plurality of data pads and off-chip drivers on memory component;
   clocking the plurality of data pads and off-chip drivers with a clock tree during the read operation, the clock tree coupled to the data pads and off-chip drivers; and
   providing an elevated voltage to the clock tree that is elevated from an externally applied voltage.

16. The method of claim 15, further comprising providing the elevated voltage from a voltage generator that generates the elevated voltage from an external voltage, which is provided from off the memory component.

17. The method of claim 15, further comprising providing the elevated voltage to the clock tree in order to decreases clock tree delay.

18. The method of claim 17, further comprising providing the elevated voltage to the clock tree in order to decreases the clock tree delay by at least one nanosecond.

19. The method of claim 17, further comprising providing the elevated voltage to the clock tree in order to improve tAC performance.

20. A method for reading from a semiconductor memory device, the method comprising:
   reading from at least one memory bank array during a read operation;
   clocking a plurality of data pads and off-chip drivers on the memory device with a clock tree during the read operation; and
   providing an elevated voltage, which is higher than an externally applied voltage, from a voltage generator to the clock tree such that the tAC performance is improved.

* * * * *